(12) United States Patent
Yamada

(10) Patent No.: US 6,781,155 B1
(45) Date of Patent: Aug. 24, 2004

(54) ELECTROLUMINESCENCE DISPLAY DEVICE WITH A DOUBLE GATE TYPE THIN FILM TRANSISTOR HAVING A LIGHTLY DOPED DRAIN STRUCTURE

(75) Inventor: Tsutomu Yamada, Gifu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/487,004

(22) Filed: Jan. 19, 2000

(30) Foreign Application Priority Data

Jan. 20, 1999 (JP) .............................................. 11-012280

(51) Int. Cl.[7] .............................................. H01L 29/04

(52) U.S. Cl. ........................ 257/72; 257/204; 257/274; 257/338; 257/368

(58) Field of Search ........................ 257/72, 204, 274, 257/338, 368, 59, 349

(56) References Cited

U.S. PATENT DOCUMENTS

| | | | |
|---|---|---|---|
| 5,828,429 A | 10/1998 | Takemura | ..................... 349/42 |
| 6,274,887 B1 | * 8/2001 | Yamazaki et al. | |
| 6,277,679 B1 | * 8/2001 | Ohtani | |
| 6,303,963 B1 | * 10/2001 | Ohtani et al. | |

* cited by examiner

*Primary Examiner*—Fetsum Abraham
(74) *Attorney, Agent, or Firm*—Cantor Colburn LLP

(57) ABSTRACT

An organic EL display device including a first TFT (30) for switching operation, a second TFT (40) for driving an organic EL element, and an organic EL element (60) having an anode (61), a cathode (66), and a light emissive element layer (65) sandwiched between these electrodes. The first TFT (30) has an n-channel and an LDD structure, exhibiting a high-speed response and superior retaining characteristics. The second TFT (40) has a p-channel, and therefore exhibits superior current controllability. By combining these two types of TFTs to drive the organic EL element for each pixel, a high ON current can be achieved with a reduced leakage current, thereby producing a quality gradation display.

11 Claims, 6 Drawing Sheets

ELECTROLUMINESCENCE DISPLAY DEVICE WITH A DOUBLE GATE TYPE THIN FILM TRANSISTOR HAVING A LIGHTLY DOPED DRAIN STRUCTURE

BACKGROUND OF THE INVENTION

1. Field of the Invention

The present invention relates to an electroluminescence display device provided with an electroluminescence element and a thin film transistor.

2. Description of the Related Art

In recent years, electroluminescence (hereinafter referred to as EL) display devices employing EL elements have attracted attention as an alternatives to devices such as CRTs and LCDs. For example, EL display devices including a thin film transistor (hereinafter referred to as TFT) used as a switching element for driving the EL elements have been researched and developed.

FIG. 1 is an equivalent circuit diagram of a related art EL display device including an EL element and TFTS.

The EL display device shown in FIG. 1, which illustrates a portion near a gate signal line Gn in the $n^{th}$ row and a drain signal line Dm in the $m^{th}$ column, includes first and second TFTS 130 and 140, and an organic EL element 160.

The gate signal line Gn for supplying a gate signal and a drain signal line Dm for supplying a drain signal cross each other, and the organic EL element 160 and the TFTs 130 and 140 for driving the organic EL element 160 are provided near an intersection of these signal lines.

The first TFT 130 for switching operation includes a gate electrode 131 connected to the gate signal line Gn and receiving the gate signal, a drain electrode 132 connected to the drain signal line Dm and receiving the drain signal, and a source electrode 133 connected to a gate electrode 141 of the second TFT 140.

The second TFT 140 for driving the organic EL element includes the gate electrode 141 connected to the source electrode 133 of the first TFT 130, a source electrode 142 connected to an anode 161 of the organic EL element 160, and a drain electrode 143 connected to a driving power supply 150 for supplying a current to the organic EL element 160.

The organic EL element 160 includes the anode 161 connected to the source electrode 142, a cathode 162 connected to a common electrode 164, and a light emissive element layer 163 sandwiched between the anode 161 and the cathode 162.

The device further includes a storage capacitor 170 having one electrode 171 connected between the source electrode 133 of the first TFT 130 and the gate electrode 141 of the second TFT 140, and the other electrode 172 connected to a common electrode 173.

A method of driving the circuit shown in the equivalent circuit diagram of FIG. 1 will next be described with reference to signal timing charts in FIG. 2, in which signal timings of a signal VG(n)1 supplied to the gate electrode 131 of the first TFT 130 in the $n^{th}$ row, a drain signal VD at the drain signal line Dm, and a signal VG(n)2 supplied to the gate electrode 141 of the second TFT 140 in the $n^{th}$ row are illustrated in (a)–(c), respectively.

When the gate signal VG(n)1 illustrated in FIG. 2(a) is applied from the gate signal line Gn to the gate electrode 131, the first TFT 130 is switched on. As a result, the drain signal VD illustrated in FIG. 2(b) is supplied from the drain signal line Dm to the gate electrode 141, which attains the same potential as the drain signal line Dm. A current corresponding to the value of a voltage applied to the gate electrode 141 is then supplied from the driving power supply 150 to the EL element 160, which is caused to emit light.

It should be noted that in actual operation, while the first TFT 130 is in ON state, a current flows until the gate electrode 141 attains the same potential as the drain signal line Dm and electric charges are stored in a gate capacitor of the gate electrode 141. After the first TFT 130 is turned off, the electric charges stored in the gate capacitor must be maintained, and also the potential of the gate must be retained as illustrated by the broken line in FIG. 2(c).

In the above-described EL display device, however, a leakage current flows during the OFF period of the TFT. As a result, when the drain signal VD changes every horizontal period (IH) as illustrated in FIG. 2(b), the potential VG(n)2 of the gate electrode 141 cannot be maintained, but is changed as shown by the solid line in FIG. 2(c).

More specifically, as illustrated by the solid line in FIG. 2(c), (i) when the potential of the drain signal line Dm is lower than that supplied to the gate electrode 141, a leakage current flows to the drain signal line Di through the first TFT 130, decreasing the potential of the gate electrode 141; and (ii) when the potential of the drain signal line Dm is higher than that supplied to the gate electrode 141, a leakage current flows to the gate electrode 141 through the first TFT 130, resulting in further storage of electric charges in the gate capacitor and in a higher potential of the gate electrode 141.

In configuration (i) above, the organic EL element 160 receives a current larger than it is supposed to receive, leading to a higher luminance of the organic EL element. On the other hand, the element 160 will have a lower luminance in configuration (ii) above.

With either configuration, the device has a drawback in that it is difficult to cause each display pixel to emit light at the appropriate luminance when a large leakage current flows through the first TFT 130 as indicated by the solid line in FIG. 2(c).

The second TFT serves to control the current supplied from the power supply for driving the organic EL element in accordance with the voltage applied to the gate of the second TFT, and supply it to the organic EL element. The second TFT has an active layer that includes an intrinsic or substantially intrinsic channel region overlapping its gate, and source and drain regions located on both sides of the channel region and having impurities doped therein.

However, when the second TFT is an n-channel transistor, a so-called saturation region of the drain current-drain voltage (Id-vd) characteristics, i.e. a region where the drain current Id is constant even though the drain voltage vd is increased, is extremely narrow (saturation characteristics are poor), as indicated by broken lines in FIG. 3B. Consequently, the current value Id is increased with an increase in the value of Vd, and therefore a constant current cannot be obtained, but is affected by the voltage Vd, leading to a poor current controllability.

Especially when the TFT is formed of polycrystalline silicon, there exist grain boundaries of crystals, and electrons are trapped therein to form a potential barrier, thereby spreading a depletion layer. As a result, a strong electric field is applied to the grain boundaries at the edges of the drain electrode, whereby a collisional ionization phenomenon, in which accelerated electrons collide with lattices, occurs and the drain current is not saturated, but increased. This is a significant problem in the n-channel TFT, but rare in the p-channel TFT.

SUMMARY OF THE INVENTION

The present invention has been conceived in view of the above-described problems, and an object thereof is to provide an EL display device which creates a superior gradation (gray scale) display by, expressed in the terminology introduced above, suppressing a leakage current at the first TFT 130 to maintain the potential at the gate electrode 141 of the second TFT 140, and improving current controllability of the second TFT 140.

According to one aspect, the present invention provides an electroluminescence device which includes an electroluminescence element having a light emissive layer provided between first and second electrodes, a first thin film transistor receiving a selection signal at its gate to acquire a data signal, and a second thin film transistor provided between a driving power supply and the electroluminescence element and controlling power supplied from the driving power supply to the electroluminescence element in accordance with the data signal applied from the first thin film transistor. In this electroluminescence device, the first thin film transistor has an n-channel, and at least one of a lightly doped drain structure, an offset structure, and a multigate structure, and the second thin film transistor has a p-channel.

By employing an n-channel transistor as the first thin film transistor in this manner, a quick response can be achieved at the transistor. Further, by employing at least one of the lightly doped drain structure, the offset structure, and the multigate structure in the first thin film transistor, an off-leakage current at the transistor can be reduced, and a quick response can be made in accordance with the selection signal applied to the gate to acquire and surely maintain the data signal. When a p-channel transistor is used for the second thin film transistor, a stable current can be output in response to the drain voltage, making it possible to supply power (or current when an organic EL element is used) to the electroluminescence element from the driving power supply in a stable manner, and to suppress variation in emitted luminance at the element.

According to another aspect of the present invention, the first and second thin film transistors of the electroluminescence device include an active layer formed of non-single crystalline semiconductor layer.

According to a still another aspect of the present invention, the non-single crystalline semiconductor layer is a polycrystalline silicon layer.

According to a further aspect of the present invention, the first and second thin film transistors are of top gate or bottom gate type, having a gate electrode above or below their active layer.

According to a further aspect of the present invention, the electroluminescence element and the first and second thin film transistors form a pixel of the device, and a plurality of such pixels are arranged in a matrix on a substrate.

According to a further aspect of the present invention, drains of the respective first thin film transistors for the pixels assigned to the same column among the plurality of pixels arranged in the matrix are connected to the same data line, while gates of the respective first thin film transistors for the pixels assigned to the same row among the plurality of pixels arranged in the matrix are connected to the same scan line.

According to a further aspect of the present invention, the electroluminescence device further includes a storage capacitor connected between a source of the first thin film transistor and a gate of the second thin film transistor, and the non-single crystalline semiconductor layer used for the active layer of the first thin film transistor also serves as one electrode of the storage capacitor.

By thus providing a storage capacitor for each pixel, the data signal acquired while the first thin film transistor is selected and thus in the ON state can be maintained until the first thin film transistor is next selected, contributing to improvement in display quality. In addition, by thus forming one electrode of the storage capacitor by the non-single crystalline semiconductor film used as the active layer of the transistor, increase in number of manufacturing steps for forming the electrodes of the storage capacitor can be minimized.

According to a further aspect of the present invention, the electroluminescence element is an organic electroluminescence element having a light emissive layer formed of an organic compound. In a color display device or the like, it can be extremely advantageous to have such a light emissive layer formed of an organic compound because this configuration provides a wide variety of displayable colors and a wide range of options for the material used.

According to a further aspect, the present invention provides an electroluminescence display device which includes an electroluminescence element having a light emissive layer provided between an anode and a cathode; a first thin film transistor having an active layer which is formed of a non-single crystalline semiconductor film and which includes a source connected to a storage capacitor, a drain connected to a drain signal line, and a gate electrode provided over a channel of the active layer and connected to a gate signal line; and a second thin film transistor having an active layer which is formed of a non-single crystalline semiconductor film and which includes a drain connected to a driving power supply of the electroluminescence element, and a gate electrode connected to the source of the first thin film transistor. In the above electroluminescence display device, the first thin film transistor has an n-channel and at least one of a lightly doped drain structure, an offset structure, and a multigate structure, while the second thin film transistor has a p-channel.

In a further aspect, the present invention provides an electroluminescence display device which includes an electroluminescence element having a light emissive layer provided between an anode and a cathode; a first thin film transistor having an active layer which is formed of a non-single crystalline semiconductor film and which includes a source connected to a storage capacitor, a drain connected to a drain signal line, and a gate electrode provided under a channel of the active layer and connected to a gate signal line; and a second thin film transistor having an active layer which is formed of a non-single crystalline semiconductor film and which includes a drain connected to a driving power supply of the electroluminescence element, and a gate electrode connected to the source of the first thin film transistor. In the above electroluminescence display device, the first thin film transistor has an n-channel and at least one of a lightly doped drain structure, an offset structure, and a multigate structure, while the second thin film transistor has a p-channel.

Because the above-described EL device and EL display device according to the present invention includes the first TFT allowing high speed writing with good retention characteristics and the second TFT with good current controllability, an excellent gradation (gray scale) display can be realized.

DESCRIPTION OF THE PREFERRED EMBODIMENTS

Preferred embodiments of EL display devices of the present invention will next be described.

First Embodiment

Figure 4:
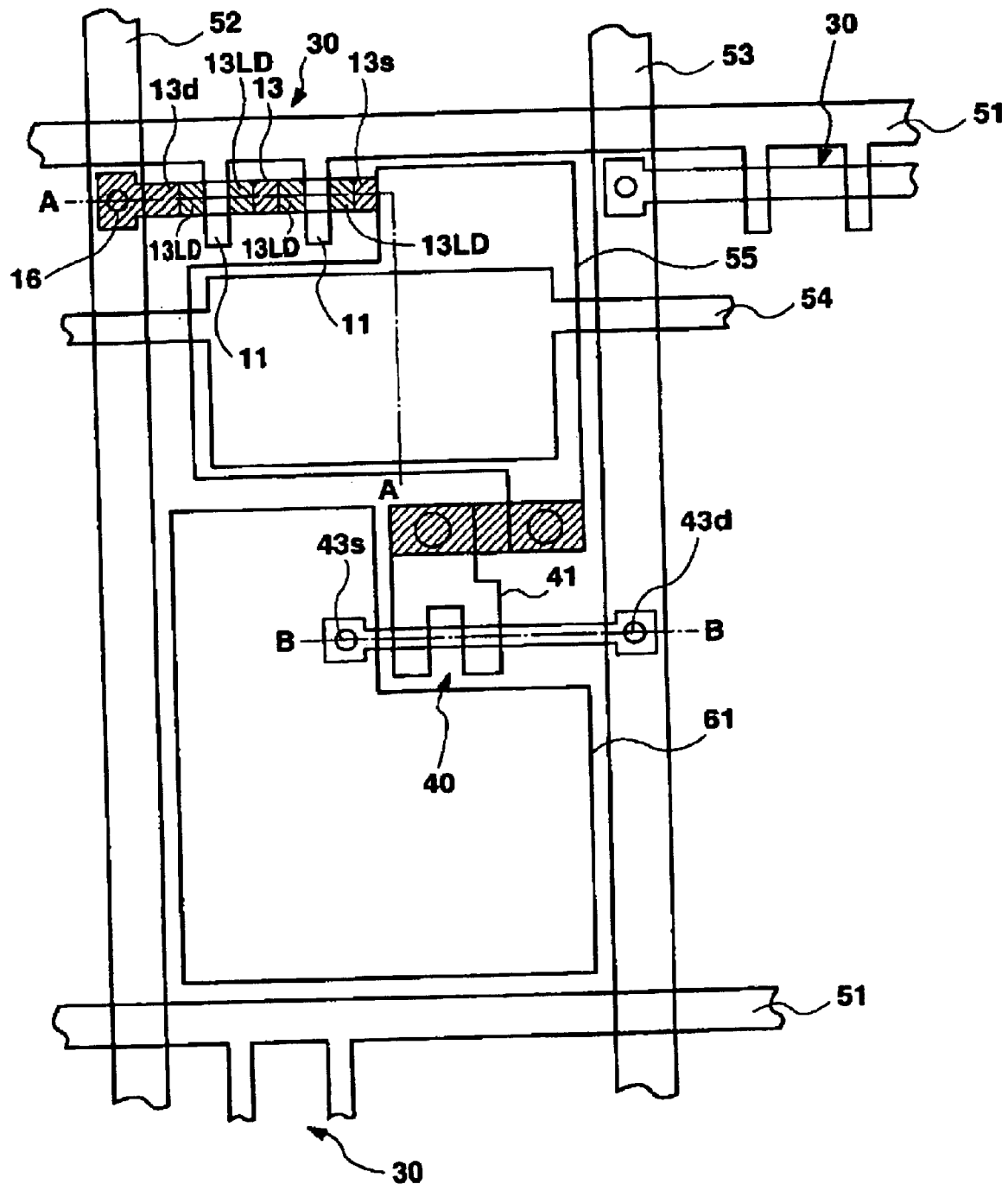
FIG. 4 is a plan view schematically showing an EL display device of the present invention.

FIG. 4 is a plan view showing a single display pixel when the present invention is applied to an organic EL display device.

Figure 5A:
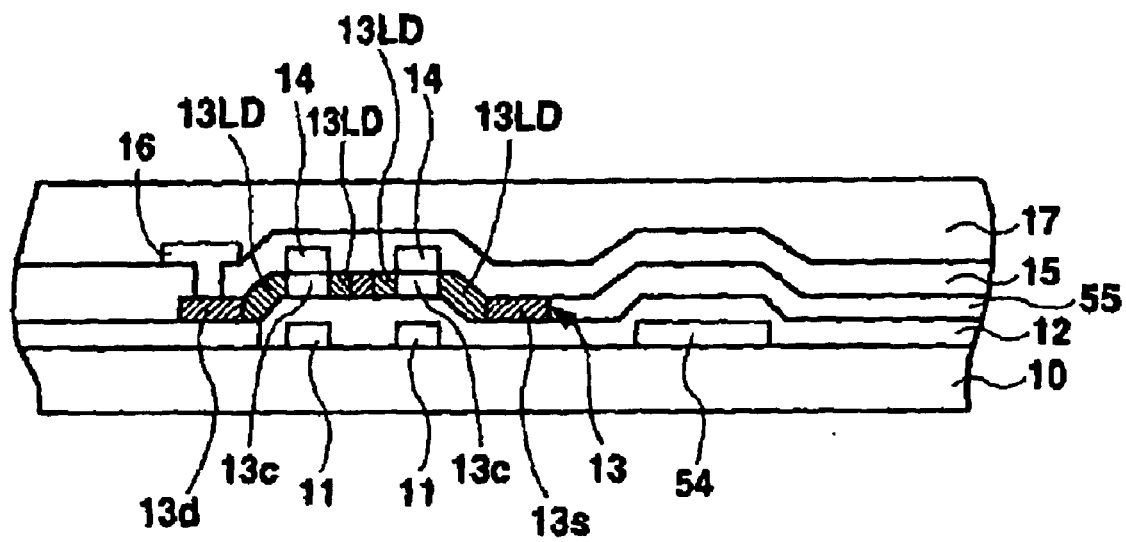
FIGS. 5A and 5B are cross sectional views taken along the lines A—A and B—B in FIG. 4, respectively.
Figure 5B:
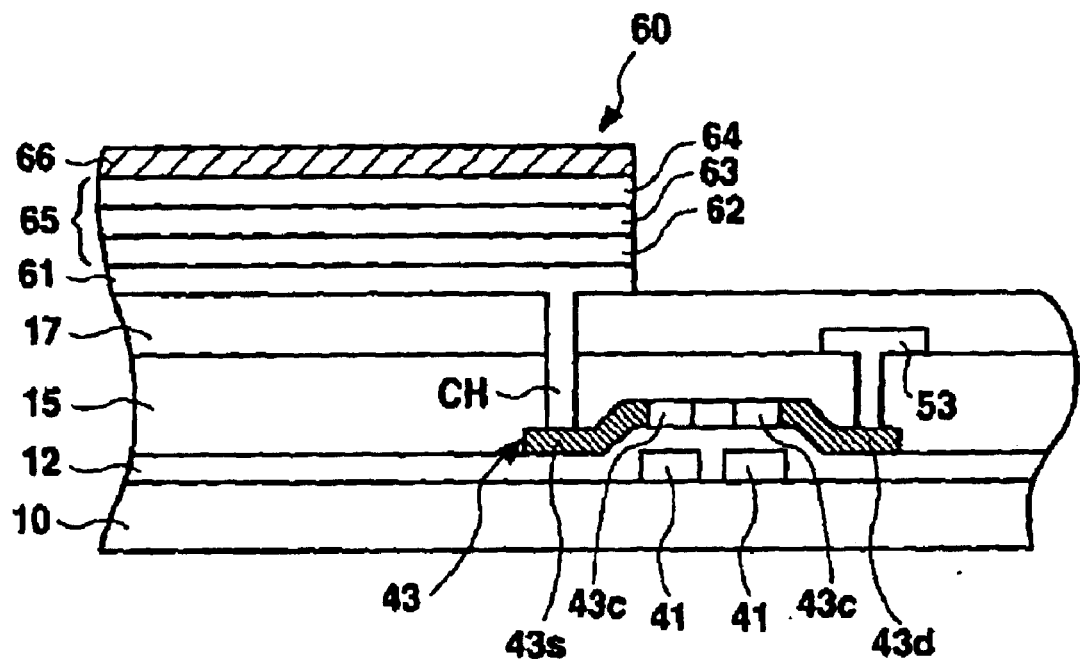

FIGS. 5A and 5B are cross sectional views taken along the lines A—A and B—B in FIG. 4, respectively.

Referring to FIG. 4, a display pixel is formed in a region surrounded by gate signal lines 51 and drain signal lines 52.

A first TFT 30 is provided adjacent to an intersection of these lines. The TFT 30 has a source 13s serving as an electrode 55 forming a storage capacitor with a storage capacitor electrode line 54 described hereinafter, and connected to a gate 41 of a second TFT 40. The second TFT 40 has a source 43s connected to an anode 61 of an organic EL element, and a drain 43d connected to a driving power supply line 53 for driving the organic EL element.

The storage capacitor electrode line 54 is disposed in parallel to the gate signal line 51 near the TFT. This line 54 may be formed of chromium or the like, and electric charges are stored between the line 54 and the capacitor electrode 55 connected to the source 13s of the TFT with a gate insulating film 12 interposed therebetween. The storage capacitor electrode line 54 and the capacitor electrode 55 form a storage capacitor, which is provided for retaining the voltage applied to the gate electrode 41 of the second TFT 40.

Referring to FIGS. 5A and 5B, the organic EL display device is formed by stacking TFTs and organic EL elements in order on a substrate 10 such as a substrate formed of glass, synthetic resin, or the like, a conductive substrate, and a semiconductor substrate. It should be noted that when a conductive or semiconductor substrate is used for the substrate 10, the TFTs and organic EL display device are provided on an insulating film of $SiO^2$, SiN, or the like, which is formed on the substrate 10.

In the present embodiment, both the first and second TFTS and 40 are of the bottom gate type, in which a gate electrode is provided under an active layer 13 formed of polycrystalline silicon (hereinafter referred to as "p-Si") film. The TFT in this embodiment also includes the gate electrode 11 of the double gate type.

The first TFT 30 for switching operation will next be described.

Referring again to FIG. 5A, the gate signal line 51 which also serves as the gate electrode 11 and formed of refractory metal such as chromium (Cr) and molybdenum (Mo), and the drain signal line 52 formed of Al are provided on the insulating substrate 10 formed of, for example, quartz glass, non-alkaline glass, or the like. Next, the driving power supply line 53 is formed of Al, serving as a driving power supply for the organic EL element and connected to the driving power supply.

Thereafter, a gate insulating film 12, and the active layer 13 of a p-Si film are formed in this order.

The active layer 13 is of a so-called LDD (lightly doped drain) structure. More specifically, ions are doped using a stopper insulating film 14 located on a channel 13c over the gate electrode 11 as a mask. Ions are further doped using a resist which covers the gate electrode 11 and the regions located on both sides of the gate electrode 11 within a predetermined distance, to thereby form a lightly doped region 13LD (indicated as the shaded area in the figure with the lines slanting from the upper left to the lower right) on either side of the gate electrode 11, and the source 13s and a drain 13d as highly doped regions (indicated as the shaded areas in the figure with the line slanting from the upper right to the lower left) located outside the lightly doped regions.

An interlayer insulating film 15, formed of an $SiO^2$ film, an SiN film and an $SiO^2$ film in that order, is provided on the entire surface, covering the gate insulating film 12, the active layer 13, and the stopper insulating film 14. A drain electrode 16 is formed by filling metal such as Al in a contact hole provided corresponding to the drain 13d. Further, a planarization insulating film 17 is formed of organic resin or the like on the entire surface for planarization.

The second TFT 40 for driving the organic EL element will next be described.

Referring to FIG. 5B, the gate electrode 41 is formed of refractory metal such as Cr and Ho on the insulating substrate formed of silica glass, non-alkaline glass, or the like.

The gate insulating film 12 and an active layer 43 formed of a p-Si film are formed in succession.

The active layer 43 includes an intrinsic, or substantially intrinsic, channel 43c provided over the gate electrode 41, and the source 43s and the drain 43d provided on respective sides of the channel 43c by doping ions using a resist to cover these side regions.

The interlayer insulating film 15 is next formed of an $SiO^2$ film, an SiN film and an $SiO^2$ film in this order over the entire surface to cover the gate insulating film 12 and the active layer 43. The driving power supply line 53 connected to a driving power supply 50 is formed by filling a metal such as Al in a contact hole provided corresponding to the drain 43d. The planarization insulating film 17 of organic resin or the like is formed over the entire surface for the purpose of planarization. A contact hole CH is formed in the planarization insulating film 17 at a position corresponding to the source 43s. A transparent electrode formed of ITO, i.e. the anode 61 of the organic EL element, is formed on the planarization insulating film 17 so as to connect to the source 43s through the contact hole CH.

The organic EL element 60 has a general structure, provided by stacking the anode 61 formed of a transparent electrode of ITO (indium tin oxide) or the like, a first hole-transport layer 62 of MTDATA (4,4-bis(3-methylphenylphenylamino)biphenyl), a second hole-transport layer 63 of TPD (4,4,4-tris(3-methylphenylphenylamino)triphenylamine), a light emissive layer 64 of Bebq2(10-benzo(h)quinolinol-beryllium complex) including quinacridon derivatives, a light emissive element layer 65 formed of an electron-transport layer of Bebq2, and a cathode 66 of magnesium-indium alloy, in this order.

In the organic EL element, holes and electrons injected from the anode and cathode, respectively, are recombined in the light emissive layer to excite organic molecules forming the light missive layer, thereby producing exactions. Light is released from the light emissive layer during the process in which the exactions deactivate, and this release of light to the outside from the transparent anode through the transparent insulating substrate results in light being emitted.

Figure 1:
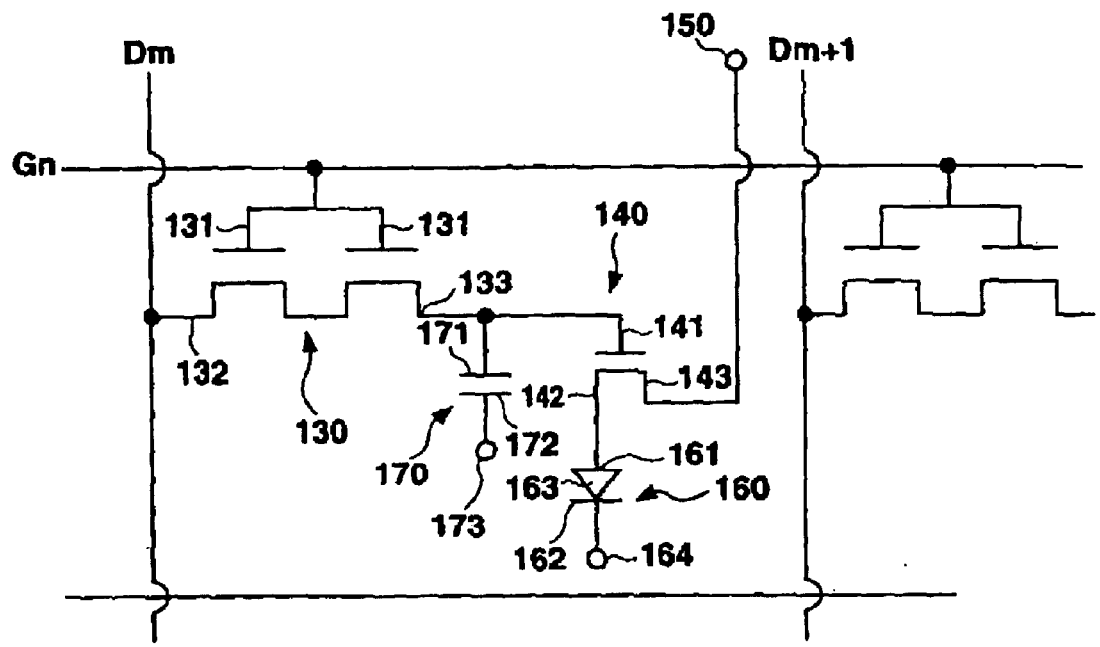
FIG. 1 is an equivalent circuit diagram of an organic EL display device of a related art.
Figure 2:
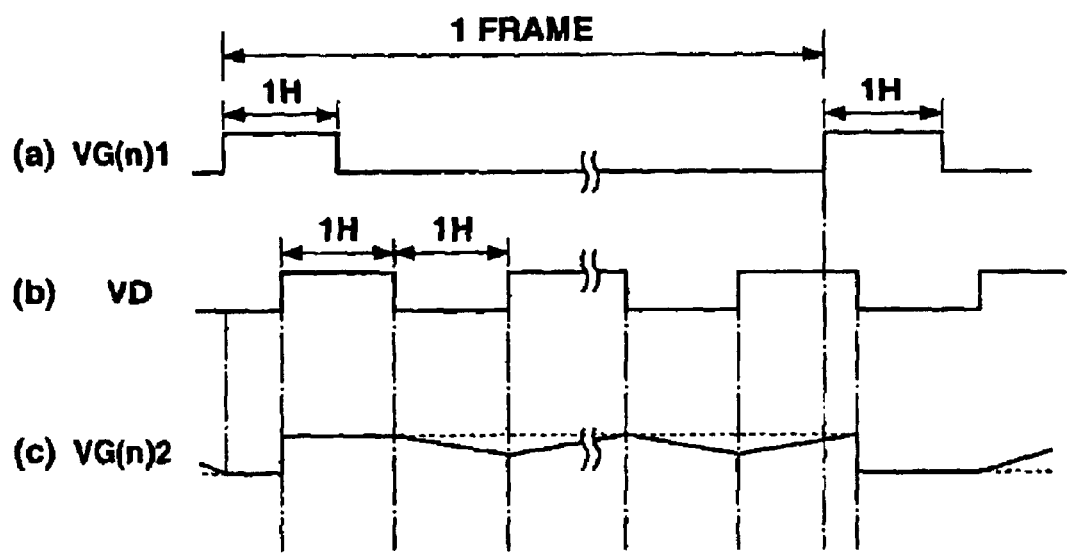
FIG. 2 illustrates timing charts for driving an organic EL display device of the related art.
Figure 6:
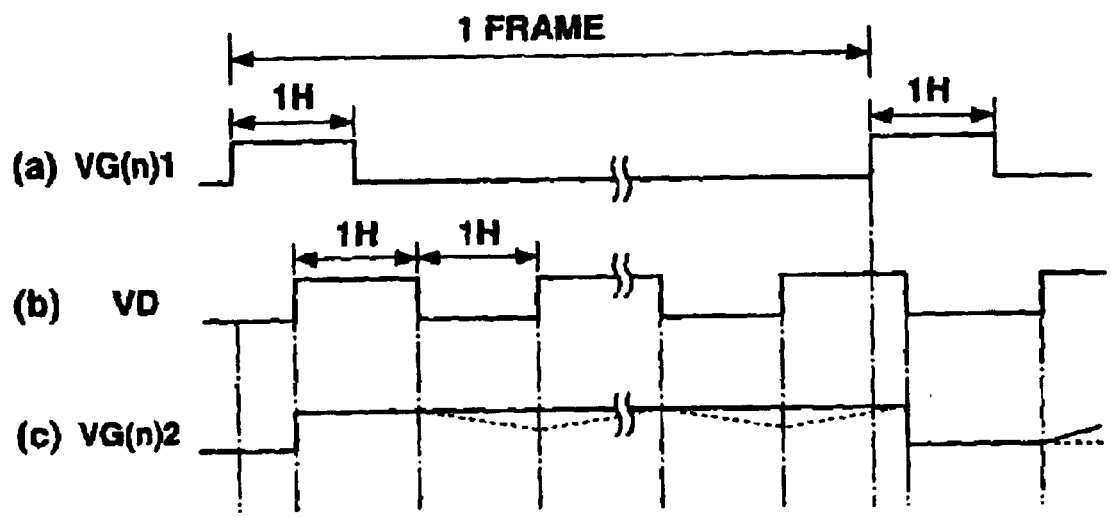
FIG. 6 illustrates timing charts for driving the EL display device of the present invention.

FIG. 6 illustrates signal timing charts. It should be noted that the circuit of the organic EL display device according to the present embodiment corresponds to that shown in FIG. 1.

Referring to FIG. 6, the charts (a)–(c) show timings of the signal VG(n)1 supplied to the gate electrode of the first TFT in the $n^{th}$ row, the drain signal VD in the $m^{th}$ column, and the signal VG(n)2 at the gate electrode of the second TFT in the $n^{th}$ row, respectively.

As shown in FIG. 6(a), when the gate signal is applied to the gate 11 connected to the gate signal line Gn, the first TFT attains and maintains the ON state for a horizontal period (1H), after which it is switched off. Referring to FIG. 6(c), when the first TFT attains the ON state, the drain signal shown in FIG. 6(b) is applied from the drain signal line Dm to the gate electrode 41 through the source 43s, whereby the gate electrode 41 attains the same potential as the drain signal line Dm. When the gate electrode 41 attains this potential, the second TFT 40 is turned on, and a current of the value corresponding to that of the gate electrode 41 is supplied from the driving power supply 50 to the anode 61 of the organic EL element 60 through the drain 43d and the source 43s. As a result, the organic EL element 60 emits light.

The display pixels having the above-described structure are arranged in a matrix on the substrate 10 to form an organic EL display device.

Figure 3A:
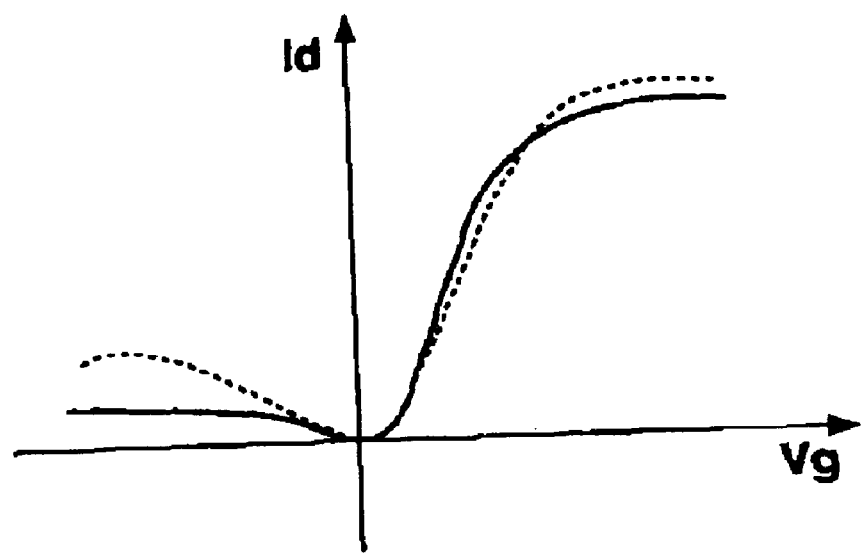
FIGS. 3A and 3B illustrate characteristics of a TFT.

As described above, according to the present invention, the first TFT 30 is an n-channel TFT with an LDD structure, having the active layer 13 with the source and drain doped with n-type impurities, so that a high electric-field mobility can be achieved, and a leakage current of the first TFT 30 can be suppressed. Therefore, writing operation can be performed at a high speed, and a good voltage retaining properties can be obtained. Consequently, writing can be achieved following the drain signal that changes each horizontal period (1H) as shown in FIG. 6(b), and the potential of the gate electrode 41 can be maintained as indicated by the solid line in FIG. 6(c) without a change observed in devices of the related art as indicated by the broken line in the figure. In addition, a high ON current can be achieved as indicated by the solid line in FIG. 3A, making it possible to supply the current for light emission to the organic EL element in a stable manner without a decrease.

Figure 3B:
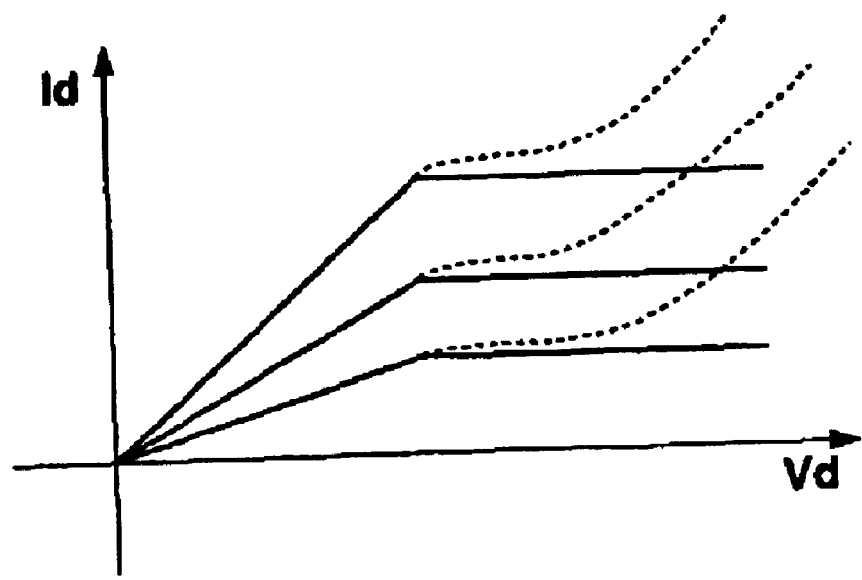

As the second TFT 40 is a p-channel TFT having an active layer with the source and drain doped with p-type impurities, a wider saturation region of the Id-vd characteristics can be achieved as indicated by the solid line in FIG. 3B, so that the value Id is not easily changed in accordance with the value Vd. In other words, variation in the value of the drain current caused by the change in the drain voltage can be reduced, whereby the emitted luminance of the organic EL device can be made uniform with good reproductivity, so that a quality gradation display gray scale) can be obtained.

As described earlier in the specification, grain boundaries are present especially in the polycrystalline silicon TFT, resulting in a potential barrier to be created by electrons trapped in the grain boundaries, and in spread of a depletion layer. Consequently, a strong electric field is applied to the grain boundaries at the edges of the drain electrode, generating a collisional ionization phenomenon where the accelerated electrons collide with lattices. This phenomenon is much more insignificant in a p-channel TFT than in an n-channel TFT, and the drain current exhibits a saturation region to provide good saturation characteristics. Therefore, a p-channel TFT is used for the second TFT.

As described above, the first TFT with an n-channel and the LDD structure, and the second TFT with a p-channel are employed, to thereby provide an organic EL display device which allows a high-speed writing and reduction in leakage current and provides emitted luminance with good reproductivity.

Second Embodiment

Figure 7:
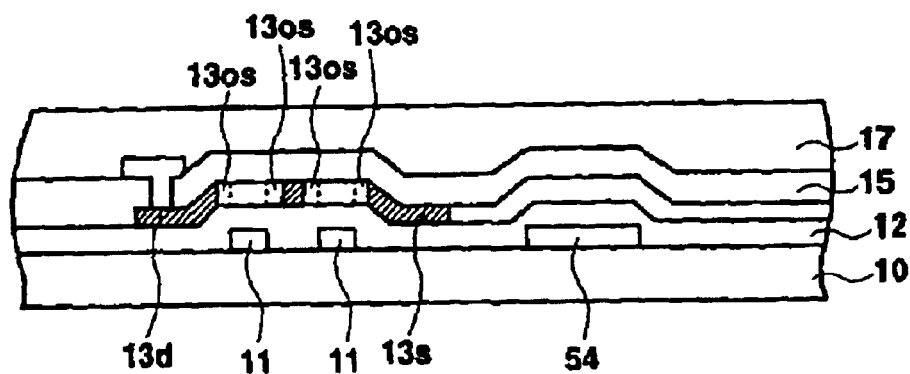
FIG. 7 is a cross sectional view of an EL display device of the present invention with a different structure, taken along the line A—A in FIG. 4.

FIG. 7 is a cross sectional view illustrating the first TFT of the EL display device according to the present invention.

The device of the second embodiment differs from that of the first embodiment primarily in that the first TFT has an n-channel, and a double gate structure and an offset structure as shown in FIG. 7.

Referring to FIG. 7, in the first TFT, an active layer of p-Si provided on the stacked layers of the gate electrode 11 and the gate insulating film 12 includes intrinsic or substantially intrinsic regions 130S over the gate electrode 11 on both sides thereof. These regions function as so-called offset regions the TFT further includes the source 13s and the drain 13d doped with n-type impurities such as phosphorus indicated by the shaded regions in FIG. 7. Thus, the first TFT has a so-called offset structure including such offset regions.

Because the first n-channel TFT has double gate and offset structures, both high electric-field mobility and a reduction in a leakage current are obtained. Further, by using a p-channel TFT as the second TFT as in the first embodiment, variation in the drain current caused by the drain voltage can be reduced, providing an organic EL display device having organic EL elements with uniform emitted luminance and good reproductivity and allowing a good gradation display.

Third Embodiment

The present embodiment relates to a device which includes TFTs of the so-called top gate type, where the gate electrode is provided over the active layer 13, as the first and second TFTs 30 and 40. In addition, the TFT in this embodiment includes the gate electrodes 11 to form a double gate structure.

Figure 8A:
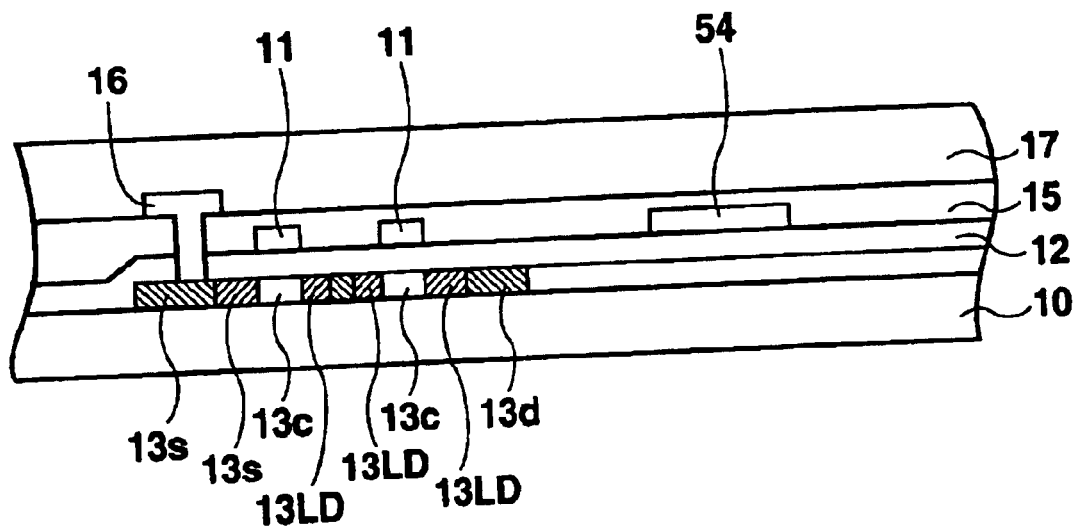
FIGS. 8A and 8B are cross sectional views of an EL display device of the present invention with different structures, taken along the lines A—A and B—B in FIG. 4, respectively.
Figure 8B:
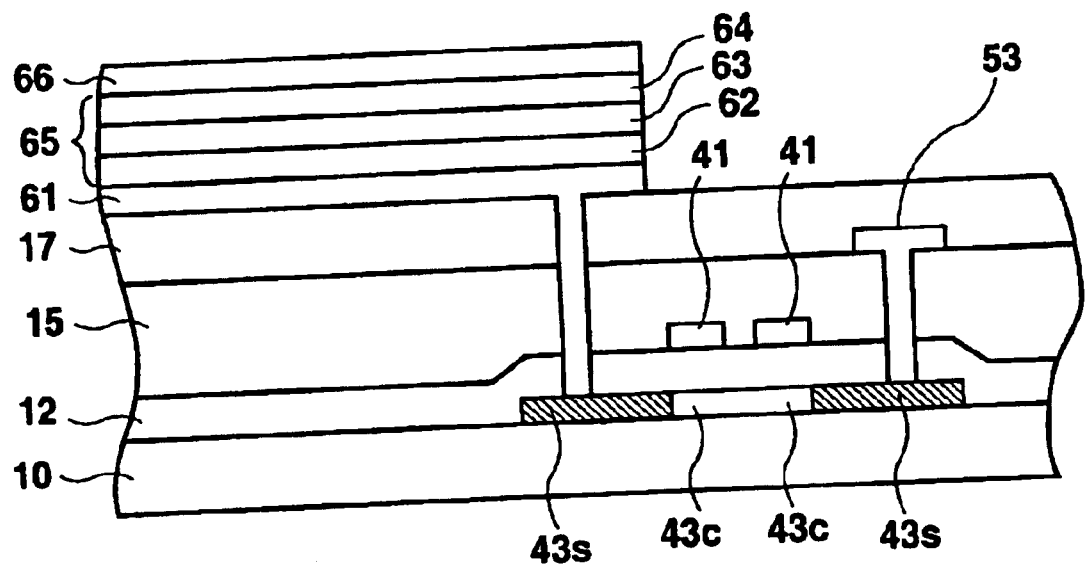

FIGS. 8A and 8B are cross sectional views respectively illustrating the first and second TFTs.

Referring to FIG. 8A, an active layer of p-Si is formed on the insulating substrate 10. The active layer 13 includes channels 13c overlapping the two gate electrodes 11 with the gate insulating film 12 interposed therebetween, and lightly doped regions 13LD doped with n-type, low concentration impurities such as phosphorus and provided on both sides of the channels 13c.

Further, heavily doped regions doped with n-type impurities are formed as the source 13s and the drain 13d.

Thus, the first switching TFT having the LDD structure and the top gate structure are formed.

Referring to FIG. 8B, the active layer 43 is formed on the insulating substrate 10 at the same time the active layer 13 of the first TFT is formed. Similarly to the first TFT, the active layer 43 includes the channel 43c overlapping the two gate electrodes 41 with the gate insulating film 12 interposed therebetween, and the source 43s and the drain 43d formed on both sides of the channel 43c by doping p-type impurities such as boron (B). The source 43s is connected to the anode 61 of the organic EL element. The structure of the organic EL element will not be described again because the structure corresponds to that structure previously described with reference to the first embodiment.

The second p-channel TFT used for driving the organic EL element is thus formed.

As described above, similarly to those with a bottom gate structure, first and second TFTs with top gate structures also exhibit a high electric-field mobility, leading to a high-speed writing and a smaller leakage current, to thereby obtain the first TFT with good voltage-retaining properties, and the second TFT with superior saturation characteristics and less variation in current.

As a result, an organic EL display device that excels in video signal retaining properties and provides a good gradation display can be achieved.

While the first TFT is described as having a double gate structure in the above embodiments, the present invention is not limited thereto, and can be applied to a multigate structure having three or more gate electrodes.

Likewise, although a p-Si film is used for the active layer in the above embodiments, a microcrystalline silicon film or an amorphous silicon film can also be used.

While an organic EL display device is described in the above embodiments, the present invention is not limited to application thereto, and can also be applied, with similar effect, to other light emissive display devices such as an inorganic El display device having a light emissive layer of inorganic material or to a vacuum fluorescent display having a fluorescent layer between an anode and a cathode.

What is claimed is:

1. An electroluminescence device, comprising:
an electroluminescence element having a light emissive layer provided between first and second electrodes;
a first thin film transistor receiving a selection signal at its gate to acquire a data signal; and
a second thin film transistor provided between a driving power supply and said electroluminescence element, and controlling power supplied from said driving power supply to said electroluminescence element in accordance with the data signal supplied from said first thin film transistor; wherein
said first thin film transistor is a double gate type having a lightly doped drain structure, said first thin film transistor has at least one of an n-channel, an offset structure, and a multigate structure; and
said second thin film transistor has a p-channel.

2. The electroluminescence device according to claim 1, wherein said first and second thin film transistors include an active layer formed of non-single crystalline semiconductor layer.

3. The electroluminescence device according to claim 2, wherein said non-single crystalline semiconductor layer is a polycrystalline silicon layer.

4. The electroluminescence device according to claim 1, wherein said first and second thin film transistors are of top gate or bottom gate type, having a gate electrode above or below their active layer.

5. The electroluminescence device according to claim 1, wherein said electroluminescence element and said first and second thin film transistors form a pixel of the device, and a plurality of said pixels are arranged in a matrix on a substrate.

6. The electroluminescence device according to claim 5, wherein
drains of the respective first thin film transistors for pixels assigned to a same column among said plurality of pixels arranged in the matrix are connected to the same data line, and
gates of the respective first thin film transistors for pixels assigned to a same row among said plurality of pixels arranged in the matrix are connected to the same scan line.

7. The electroluminescence device according to claim 6, further comprising a storage capacitor connected between a source of said first thin film transistor and a gate of said second thin film transistor, wherein
a non-single crystalline semiconductor layer used for the active layer of said first thin film transistor also serves as one electrode of the storage capacitor.

8. The electroluminescence device according to claim 1, wherein said electroluminescence element is an organic electroluminescence element having a light emissive layer formed of an organic compound.

9. An electroluminescence display device, comprising:
an electroluminescence element having a light emissive layer provided between an anode and a cathode;
a first thin film transistor having an active layer which is formed of a non-single crystalline semiconductor film and which includes a source connected to a storage capacitor, a drain connected to a drain signal line, and a gate electrode provided over a channel of said active layer and connected to a gate signal line; and
a second thin film transistor having an active layer which is formed of a non-single crystalline semiconductor film and which includes a drain connected to a driving power supply of said electroluminescence element, and a gate electrode connected to the source of said first thin film transistor; wherein
said first thin film transistor is a double gate type having a lightly doped drain structure, said first thin film transistor has at least one of an n-channel, an offset structure, and a multigate structure; and
said second thin film transistor has a p-channel.

10. An electroluminescence display device, comprising:
an electroluminescence element having a light emissive layer provided between an anode and a cathode;
a first thin film transistor having an active layer which is formed of a non-single crystalline semiconductor film and which includes a source connected to a storage capacitor, a drain connected to a drain signal line, and a gate electrode provided under a channel of said active layer and connected to a gate signal line; and
a second thin film transistor having an active layer which is formed of a non-single crystalline semiconductor film and which includes a drain connected to a driving power supply of said electroluminescence element, and a gate electrode connected to the source of said first thin film transistor; wherein said first thin film transistor is a double gate type having a lightly doped drain structure, said first thin film transistor has at least one of an n-channel, an offset structure, and a multigate structure; and said second thin film transistor has a p-channel.

11. A light emissive device, comprising:

a light emissive element having a light emissive layer provided between first and second electrodes;

a first thin film transistor receiving a selection signal at its gate to acquire a data signal; and a second thin film transistor provided between a driving power supply and said element, and controlling power supplied from said driving power supply to said element in accordance with the data signal supplied from said first thin film transistor, wherein said first thin film transistor is a double gate type having a lightly doped drain structure, said first thin film transistor has at least one of an n-channel, an offset structure, and a multigate structure; and said second thin film transistor has a p-channel.

* * * * *